(12) United States Patent
Tanaka et al.

(10) Patent No.: US 11,155,195 B2
(45) Date of Patent: Oct. 26, 2021

(54) VEHICLE LOWER PORTION STRUCTURE

(71) Applicants: Ken Tanaka, Aichi-gun Aichi-ken (JP); Yuichi Kondo, Nagoya (JP)

(72) Inventors: Ken Tanaka, Aichi-gun Aichi-ken (JP); Yuichi Kondo, Nagoya (JP)

(73) Assignees: Toyota Jidosha Kabushiki Kaisha, Toyota (JP); Hayashi Telempu Corporation, Nagoya (JP)

( * ) Notice: Subject to any disclaimer, the term of this patent is extended or adjusted under 35 U.S.C. 154(b) by 131 days.

(21) Appl. No.: 16/718,941

(22) Filed: Dec. 18, 2019

(65) Prior Publication Data

US 2020/0198512 A1    Jun. 25, 2020

(30) Foreign Application Priority Data

Dec. 25, 2018    (JP) .............................. JP2018-241659

(51) Int. Cl.
| | |
|---|---|
| B60J 7/00 | (2006.01) |
| B60N 3/04 | (2006.01) |
| B60L 50/60 | (2019.01) |
| B60K 1/00 | (2006.01) |
| B60R 16/02 | (2006.01) |
| B60R 16/03 | (2006.01) |
| B62D 25/20 | (2006.01) |
| H05K 9/00 | (2006.01) |

(52) U.S. Cl.
CPC .............. B60N 3/046 (2013.01); B60K 1/00 (2013.01); B60L 50/66 (2019.02); B60N 3/042 (2013.01); B60R 16/0207 (2013.01); B60R 16/03 (2013.01); B62D 25/20 (2013.01); H05K 9/0007 (2013.01)

(58) Field of Classification Search
CPC . H01L 2924/00014; H01L 2224/48091; H01L 2924/181; H01L 2924/00; F21Y 2115/10; B60K 23/0808; B60K 17/35; B60T 8/1755; B60T 8/266; A43B 5/048
See application file for complete search history.

(56) References Cited

U.S. PATENT DOCUMENTS

| | | | |
|---|---|---|---|
| 5,864,088 A * | 1/1999 | Sato ...................... | H01L 23/552 174/386 |
| 9,545,043 B1 * | 1/2017 | Hamilton ............... | H05K 9/003 |
| 9,836,095 B1 * | 12/2017 | Lim ........................ | G06F 1/182 |
| 2008/0067650 A1 * | 3/2008 | Sham .................... | H01L 23/552 257/678 |
| 2008/0283290 A1 * | 11/2008 | Niino ................... | H05K 9/0001 174/350 |

(Continued)

FOREIGN PATENT DOCUMENTS

| | | |
|---|---|---|
| JP | H03199473 A | 8/1991 |
| JP | 2012-153185 A | 8/2012 |

(Continued)

*Primary Examiner* — Kiran B Patel
(74) *Attorney, Agent, or Firm* — Dinsmore & Shohl LLP

(57) ABSTRACT

A vehicle lower portion structure is provided with electromagnetic wave emitting components that are disposed at a rear surface side of a floor panel provided in a lower portion of a vehicle, and a carpet component that has a backing layer in which is dispersed a magnetic material, and a carpet pile that is provided on a front surface side of the backing layer, and that is disposed at a front surface side of the floor panel.

5 Claims, 4 Drawing Sheets

(56) References Cited

U.S. PATENT DOCUMENTS

| | | | | |
|---|---|---|---|---|
| 2010/0139971 | A1* | 6/2010 | Kato | H05K 9/0083 |
| | | | | 174/388 |
| 2014/0346815 | A1* | 11/2014 | Keutz | B32B 15/18 |
| | | | | 296/193.07 |
| 2015/0243881 | A1* | 8/2015 | Sankman | G06F 1/1633 |
| | | | | 361/679.55 |
| 2020/0406803 | A1* | 12/2020 | Hernandez Covarrubias | |
| | | | | B32B 3/263 |
| 2021/0162907 | A1* | 6/2021 | Hernandez Covarrubias | |
| | | | | B60R 13/0815 |

FOREIGN PATENT DOCUMENTS

| | | |
|---|---|---|
| JP | 2015-42448 A | 3/2015 |
| KR | 2018-0049951 A | 5/2018 |

* cited by examiner

VEHICLE LOWER PORTION STRUCTURE

CROSS-REFERENCE TO RELATED APPLICATION

This application is based on and claims priority under 35 USC 119 from Japanese Patent Application No. 2018-241659 filed on Dec. 25, 2018, the disclosure of which is incorporated by reference herein.

BACKGROUND

Technical Field

The present disclosure relates to a vehicle lower portion structure.

Related Art

It is known conventionally that a laminated sheet having an electromagnetic wave shielding material that is formed by covering either one surface or both surfaces of a sheet-shaped fiber material with a highly electrically conductive metal can be applied to an under panel of an automobile (see, for example, Japanese Unexamined Patent Application (JP-A) No. 2015-42448 (Patent Document 1)).

However, because this laminated sheet shields electromagnetic waves using an electrically conductive material, it is only able to shield high frequency electromagnetic waves. In other words, this laminated sheet is not able to shield low frequency electromagnetic waves, whose effects on vehicle occupants (i.e., when a human body is exposed thereto) are a cause of concern. In this way, there is still room for improvement in providing a structure that is able to shield vehicle occupants from low frequency electromagnetic waves.

SUMMARY

It is, therefore, an object of the present disclosure to provide a vehicle lower portion structure that is able to shield vehicle occupants from low frequency electromagnetic waves.

A vehicle lower portion structure according to a first aspect is provided with electromagnetic wave emitting components that are disposed at a rear surface side of a floor panel provided in a lower portion of a vehicle, and a carpet component that has a backing layer in which is dispersed a magnetic material, and a carpet pile that is provided on a front surface side of the backing layer, and that is disposed at a front surface side of the floor panel.

According to the first aspect, magnetic material is dispersed in a backing layer of a carpet component that is disposed at a front surface side of a floor panel. Here, although electromagnetic waves are emitted from electromagnetic wave emitting components that are disposed at a rear surface side of the floor panel, the electromagnetic waves whose effects on vehicle occupants (i.e., when a human body is exposed thereto) is a cause of concern are low frequency electromagnetic waves, and magnetic field components contribute to the generation of these. Accordingly, if a magnetic material is dispersed in a backing layer, the orientation of the magnetic field components of the electromagnetic waves emitted from the electromagnetic wave emitting components is altered by this magnetic material to a direction away from the vehicle occupants. As a result, the vehicle occupants are shielded from the low frequency electromagnetic waves.

Moreover, a vehicle lower portion structure according to a second aspect is the vehicle lower portion structure according to the first aspect in which a density of the magnetic material dispersed in portions of the backing layer that correspond to the electromagnetic wave emitting components is higher than a density of the magnetic material dispersed in other portions of the backing layer.

According to the second aspect, a density of the magnetic material dispersed in portions of the backing layer that correspond to the electromagnetic wave emitting component is higher than a density of the magnetic material dispersed in other portions of the backing layer. Accordingly, the orientation of the magnetic field components of the electromagnetic waves emitted from the electromagnetic wage emitting components is efficiently altered by this magnetic material to a direction away from the vehicle occupants. As a result, the vehicle occupants are efficiently shielded from the low frequency electromagnetic waves.

Moreover, a vehicle lower portion structure according to a third aspect is the vehicle lower portion structure according to the first aspect in which the magnetic material is only dispersed in portions of the backing layer that correspond to the electromagnetic wave emitting components.

According to the third aspect, the magnetic material is only dispersed in portions of the backing layer that correspond to the electromagnetic wave emitting components. Accordingly, the orientation of the magnetic field components of the electromagnetic waves emitted from the electromagnetic wage emitting components is efficiently altered by this magnetic material to a direction away from the vehicle occupants. As a result, the vehicle occupants are efficiently shielded from the low frequency electromagnetic waves.

Moreover, a vehicle lower portion structure according to a fourth aspect is the vehicle lower portion structure according to the first aspect in which the backing layer is divided into a first portion that corresponds to positions of the electromagnetic wave emitting components, and a second portion, that does not correspond to the positions of the electromagnetic wave emitting components, and the magnetic material is only dispersed in the first portion.

Moreover, a vehicle lower portion structure according to a fifth aspect is the vehicle lower portion structure according to the first aspect in which the electromagnetic wave emitting components include at least one of a driving apparatus of a vehicle, a high voltage wiring that is connected to the driving apparatus, and a battery pack.

As is described above, according to the present disclosure, it is possible to shield vehicle occupants from low frequency electromagnetic waves.

DETAILED DESCRIPTION

Hereinafter, an exemplary embodiment according to the present disclosure will be described in detail based on the drawings. Note that an arrow UP, an arrow FR, and an arrow RH that are shown in the appropriate drawings respectively indicate a vehicle upward direction, a vehicle forward direction, and a vehicle right-side direction. Hereinafter, if front-rear, left-right, or up-down directions are used in the following description, then, unless specifically stated otherwise, these refer respectively to the front-rear directions of the vehicle, the left-right directions of the vehicle (i.e., the vehicle width direction), and the up-down directions of the vehicle.

Figure 1:
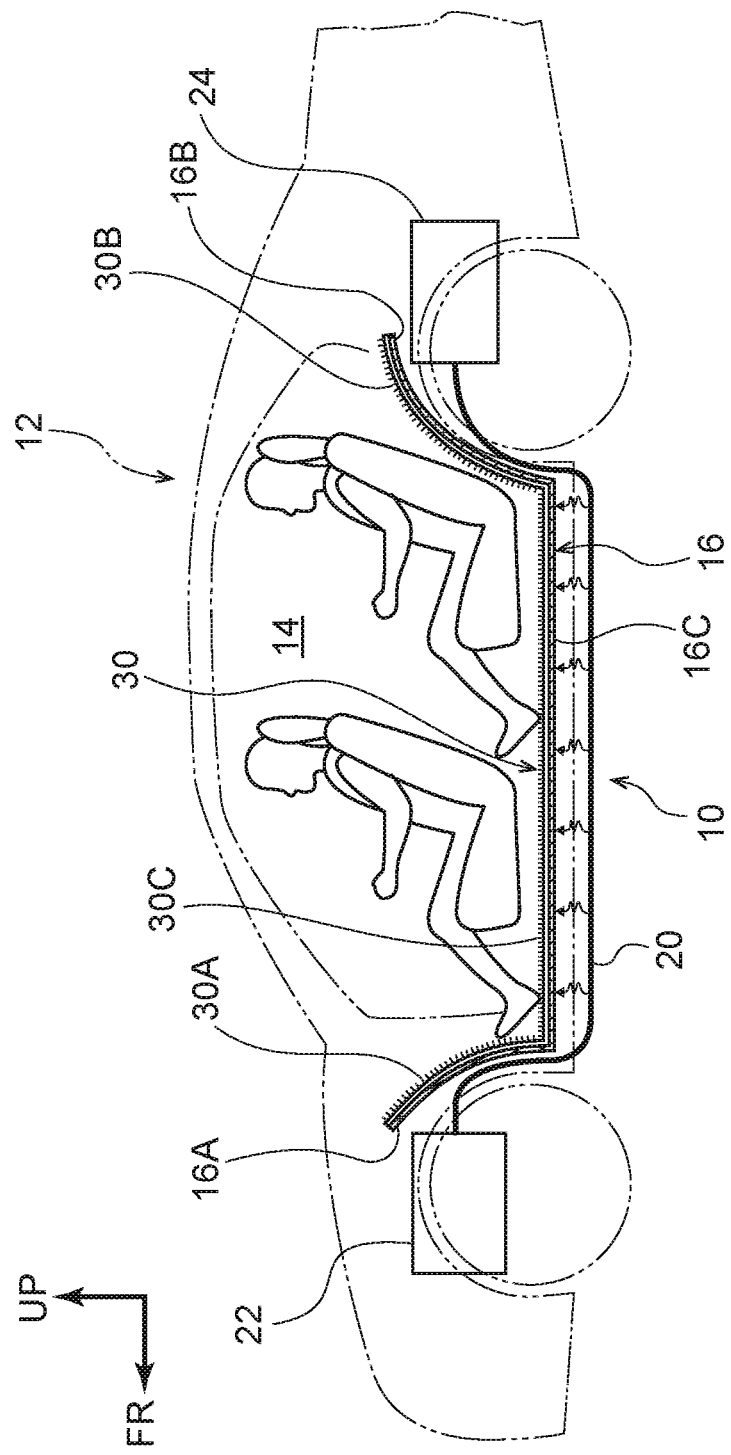
FIG. 1 is a side view showing a vehicle provided with a vehicle lower portion structure according to the present exemplary embodiment.

As is shown in FIG. 1, a floor panel 16 that forms part of a vehicle cabin 14 is provided in a lower portion of a vehicle 12 that is provided with the vehicle lower portion structure 10 according to the present exemplary embodiment. The floor panel 16 is formed substantially in a rectangular shape whose longitudinal direction extends in the vehicle front-rear direction when looked at in plan view (see FIG. 2).

A front end portion 16A of the floor panel 16 extends substantially in a circular arc shape such that, as seen in a side view looking from the vehicle width, direction, the vehicle cabin 14 side thereof extends upwards and towards the vehicle front side (so as to follow the contour of the front wheel wheelhouse). In addition, a driving apparatus 22 that is formed by a power control unit (PCU) and a motor and the like is disposed inside an engine room on a vehicle body front side of the front end portion 16A (i.e., on a rear surface side of the front end portion 16A). In other words, the vehicle 12 is a hybrid vehicle, a fuel cell vehicle, or an electric vehicle.

In addition, a rear end portion 1613 of the floor panel 16 extends substantially in a circular arc shape such that, as seen in a side view looking from the vehicle width direction, the vehicle cabin 14 side thereof extends upwards and towards the vehicle rear side (so as to follow the contour of the rear wheel wheelhouse). In addition, a driving apparatus 24 that is formed by a power control unit (PCU) and a motor and the like is disposed at a vehicle body rear side of the rear end portion 16B, and on the vehicle body front side of a luggage compartment (i.e., on a rear surface side of the rear end portion 16B).

Figure 2:
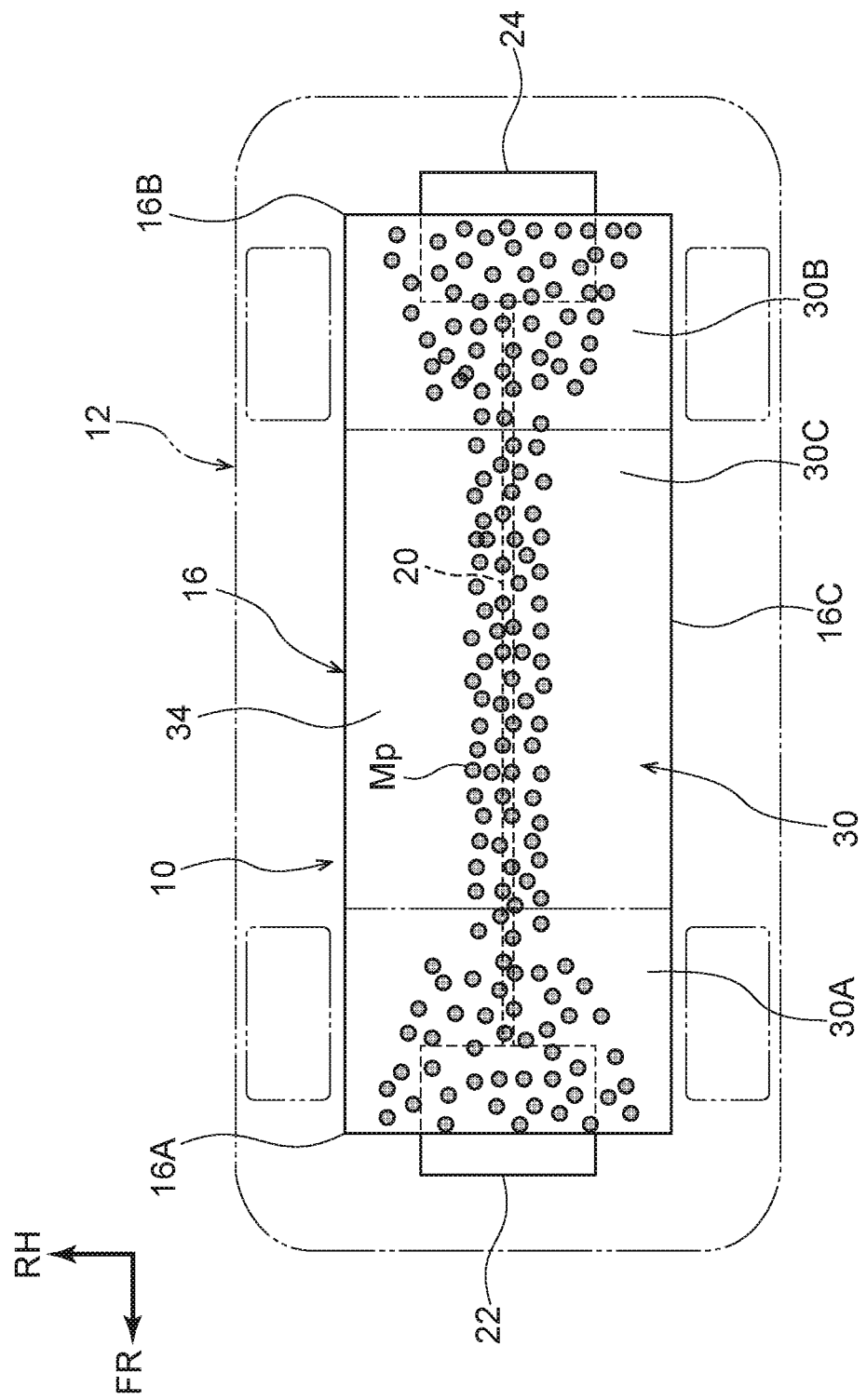
FIG. 2 is a plan view showing a backing layer of a floor carpet forming part of the vehicle lower portion structure according to the present exemplary embodiment.

Furthermore, as is shown in FIG. 1 and FIG. 2, high voltage wiring 20 is laid between the driving apparatus 22 and the driving apparatus 24 so as to pass through the vehicle body lower side (i.e., the rear surface side) of the floor panel 16, and in a substantially central portion thereof in the vehicle width direction. The high voltage wiring 20 together with the driving apparatuses 22 and 24 form the electromagnetic wave emitting components that emit electromagnetic waves in the present exemplary embodiment. Note that a battery pack (not shown in the drawings) is disposed at the vehicle body lower side (i.e., on the rear surface side) of the floor panel 16, and this battery pack is also an electromagnetic wave emitting component.

A floor carpet 30, which is serving as a carpet component, is disposed at an upper surface (i.e., on the front surface side) of the floor panel 16 so as to cover the entire upper surface of the floor panel 16 (in FIG. 2, carpet pile 32 (described below) is not shown). The floor carpet 30 has a front end portion 30A whose contour matches the contour of the front end portion 16A of the floor panel 16, a rear end portion 3013 whose contour matches the contour of the rear end portion 16B of the floor panel 16, and a flat portion 30C whose contour matches the contour of an intermediate portion 16C located between the front end portion 16A and the rear end portion 16B of the floor panel 16.

Figure 3:
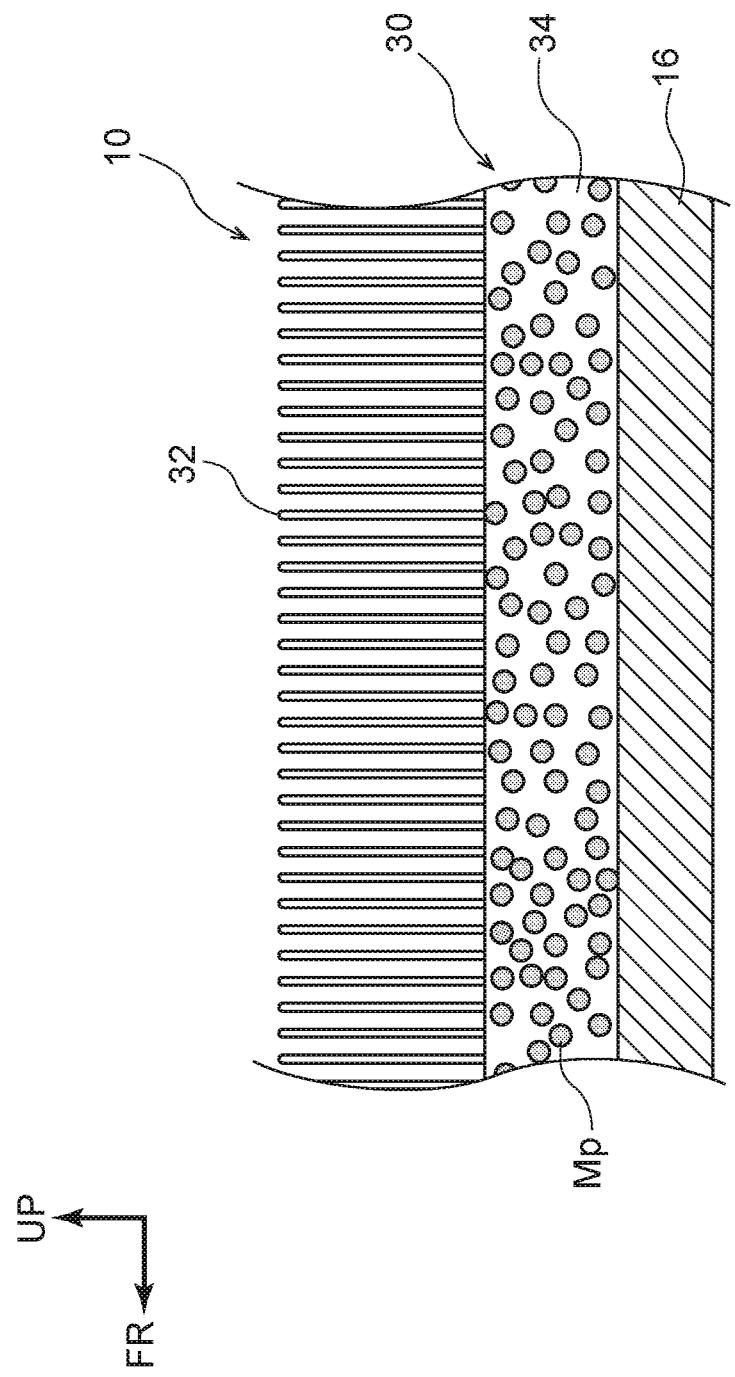
FIG. 3 is a cross-sectional view showing a structure of the floor carpet forming part of the vehicle lower portion structure according to the present exemplary embodiment.

In addition, as is shown in FIG. 3, the floor carpet 30 has a carpet pile 32, and a backing layer 34 that is provided on an upper surface (i.e., on the front surface side) of the carpet pile 32. The carpet pile 32 is formed from resin fibers such as polyamide (PA) resin, or polyethylene terephthalate (PET) resin or the like.

The backing layer 34 is formed from a resin material such as polyethylene (PE), or polyethylene terephthalate (PET) or the like, or from a rubber material, and is formed so as to inhibit or prevent the carpet pile 32 that covers the upper surface (i.e., the front surface side) thereof from coming loose. Additionally, magnetic powder Mp, which is serving as a magnetic material, is added to the backing layer 34 and is dispersed therein.

It is desirable that the magnetic powder Mp be added in an amount of 80% or more by weight to the backing layer 34, however, the present disclosure is not limited to this, and it is possible for an amount slightly less than this to be added instead. Magnetite fine particles, which are inexpensive, serve as an example of the magnetic powder Mp, however, the present disclosure is not particularly limited to this.

Moreover, as is shown in FIG. 2, it is desirable that the magnetic powder Mp be dispersed predominantly in portions of the backing layer 34 that correspond to (i.e., are located opposite) the high voltage wiring 20 and the drive apparatuses 22 and 24. In other words, it is desirable that the density of the magnetic powder Mp that is dispersed in portions of the backing layer 34 that correspond to the high voltage wiring 20 and the drive apparatuses 22 and 24 be greater than the density of the magnetic powder Mp (including cases in which no magnetic powder Mp is added in these portions) that is dispersed in other portions of the backing layer 34.

Figure 4:
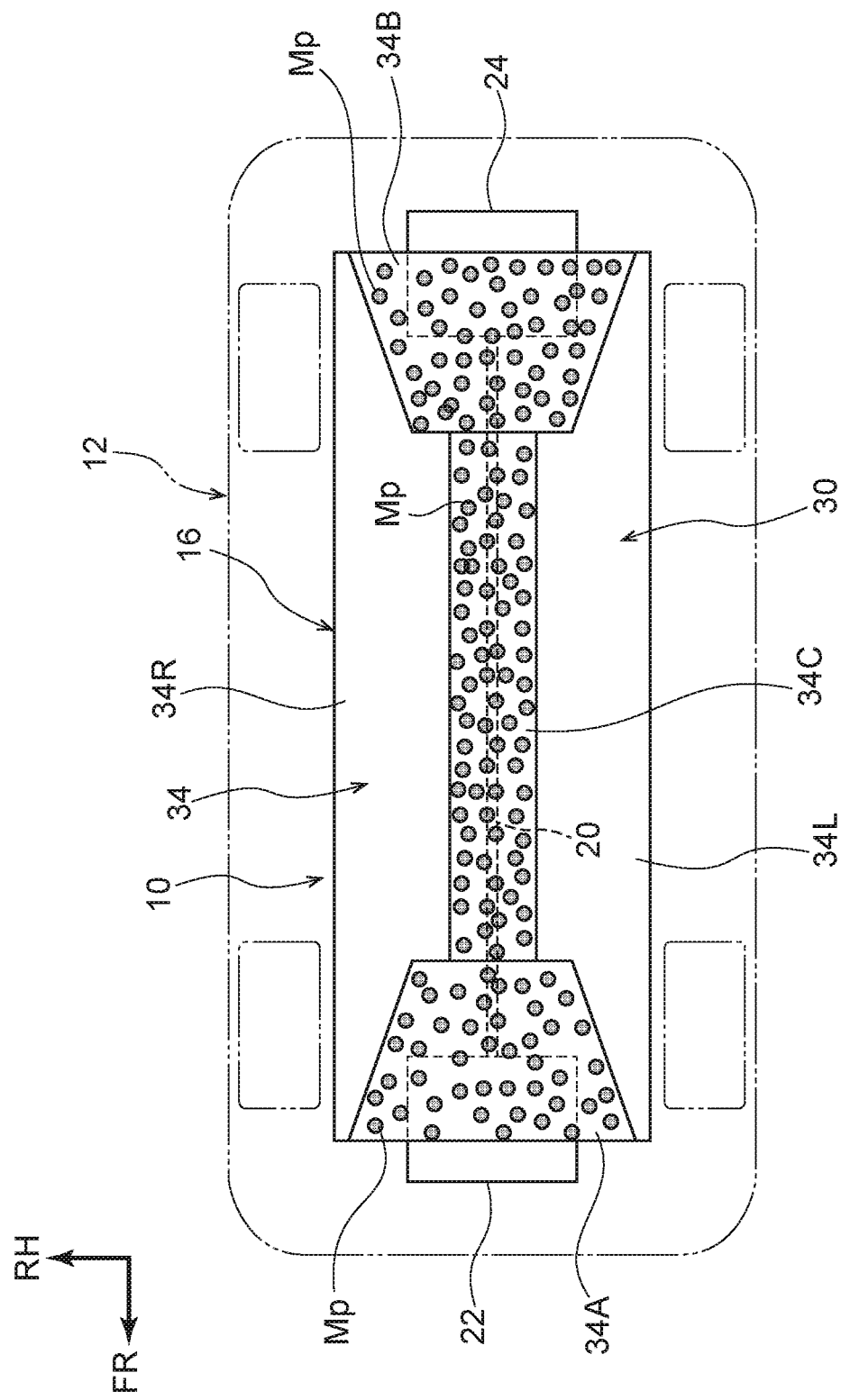
FIG. 4 is a plan view showing the backing layer of a divided type of floor carpet forming part of the vehicle lower portion structure according to the present exemplary embodiment.

Note that, as is shown, for example, in FIG. 4, this type of structure may be achieved by separating the backing layer 34 into plural sections, and adding the magnetic powder Mp separately to each section. More specifically, the backing layer 34 is divided into a front end portion 34A that corresponds to the drive apparatus 22, a rear end portion 34B that corresponds to the drive apparatus 24, an intermediate portion 34C that corresponds to the high voltage wiring 20, and a right side portion 34R and a left side portion 34L that form the remaining portions.

When manufacturing the front end portion 34A, the rear end portion 34B, the intermediate portion 34C, the left side portion 34L and the right side portion 34R, the magnetic powder Mp is only added to the front end portion 34A, the rear end portion 34B, and the intermediate portion 34C. Once the separate sections of the backing layer 34 have been prepared in this way, each section is joined to the upper surface of the floor panel 16. As a result, the floor carpet 30 having the backing layer 34 in which the dispersion of the magnetic powder Mp is predominantly concentrated only in portions that correspond to the high voltage wiring 20 and the drive apparatuses 22 and 24 is obtained.

Next, actions performed by the vehicle lower portion structure 10 of the present exemplary embodiment which has the above-described structure will be described.

As is described above, the floor carpet 30 is disposed at the upper surface of the floor panel 16. In addition, the magnetic powder Mp is added to the backing layer 34 of the floor carpet 30 and is dispersed therein. Here, electromagnetic waves are emitted from the high voltage wiring 20 and the driving apparatuses 22 and 24, however, the particular electromagnetic waves whose effects on vehicle occupants (i.e., when a human body is exposed thereto) are a cause of concern are low frequency electromagnetic waves, and magnetic field components contribute to the generation of these.

Accordingly, if the magnetic powder Mp is dispersed in the backing layer 34, the orientation of the magnetic field components of the electromagnetic waves emitted from the high voltage wiring 20 and the driving apparatuses 22 and 24 is altered by this magnetic powder Mp to a direction moving away from the vehicle occupants. As a result, the vehicle occupants can be shielded from the low frequency electromagnetic waves, and any effects on the vehicle occupants caused by these low frequency electromagnetic waves can be inhibited or prevented.

In particular, if the density of the magnetic powder Mp that is dispersed in portions of the backing layer 34 that correspond to the high voltage wiring 20 and the drive apparatuses 22 and 24 is greater than the density of the magnetic powder Mp that is dispersed in other portions of the backing layer 34 (i.e., if the magnetic powder Mp is only dispersed in portions of the backing layer 34 that correspond to the high voltage wiring 20 and the drive apparatuses 22 and 24), then the orientation of the magnetic field components of the electromagnetic waves emitted from the high voltage wiring 20 and the driving apparatuses 22 and 24 can be efficiently altered to a direction away from the vehicle occupants.

Accordingly, the vehicle occupants can be efficiently shielded from low frequency electromagnetic waves.

Moreover, according to the above-described structure, because the quantity of magnetic powder that is added to the backing layer 34 can be reduced to the minimum required quantity, and compared with when the magnetic powder Mp is dispersed equally over the entire backing layer 34, not only can any increase in the manufacturing costs of the floor carpet 30 be inhibited, but any increase in the mass (i.e., the weight) of the floor carpet 30 can also be inhibited. Consequently, any deterioration in the fuel consumption of the vehicle 12 that would accompany such an increase in weight can also be inhibited.

Moreover, because the magnetic powder Mp has been dispersed in the backing layer 34, the mass (i.e., the weight) of the floor carpet 30 increases compared with when magnetic powder Mp is not added to the backing layer 34. Accordingly, the weight of the floor panel 16 on which the floor carpet 30 is provided can be increased, so that at least a portion of whatever vibration is generated in the vehicle 12 can be suppressed by this floor panel 16. In other words, the floor carpet 30 having the above-described structure is effective in reducing noise vibration in the vehicle 12.

The vehicle lower portion structure 10 according to the present exemplary embodiment has been described above based on the drawings, however, the vehicle lower portion structure 10 according to the present exemplary embodiment is not limited to the above-described structure, and various suitable design modifications and the like may be made to the present disclosure insofar as they do not depart from the spirit or scope of the present disclosure. For example, the method used to disperse the magnetic powder Mp predominantly in portions of the backing layer 34 that correspond to the high voltage wiring 20 and the drive apparatuses 22 and 24 is not limited to the method shown in FIG. 4.

In addition, it is also possible for magnetic powder Mp to be added to left side portion 34L and the right side portion 34R, which are the other portions of the backing layer 34 that do not correspond to the high voltage wiring 20 and the drive apparatuses 22 and 24, and dispersed therein provided that the density of the magnetic powder Mp in these portions is lower than the density of the magnetic powder Mp that is dispersed in the front end portion 34A, the rear end portion 34B, and the intermediate portion 34C of the backing layer 34 shown in FIG. 4.

Moreover, the high voltage wiring 20 is not limited to a structure in which this wiring is laid through substantially a central portion in the vehicle width direction of the floor panel 16, and it is possible for the high voltage wiring 20 to instead be laid, for example, through the left end portion side or the right end portion side of the floor panel 16. In this case, when the backing layer 34 is being prepared in the plural separate sections, the magnetic, powder Mp may be added to the left side portion 34L or the right side portion 34R instead of to the intermediate portion 34C.

Additionally, in the ease of a front-wheel drive vehicle, because only the drive apparatus 22 is provided, it is possible for the magnetic powder Mp to be omitted from the rear end portion 34B when the backing layer 34 is being prepared in the plural separate sections. In the same way, in the case of a rear-wheel drive vehicle, because only the drive apparatus 24 is provided, it is possible for the magnetic powder Mp to be omitted from the front end portion 34A when the backing layer 34 is being prepared in the plural separate sections.

What is claimed is:

1. A vehicle lower portion structure comprising:
   electromagnetic wave emitting components that are disposed at a rear surface side of a floor panel provided in a lower portion of a vehicle; and
   a carpet component that has a backing layer in which is dispersed a magnetic material, and a carpet pile that is provided on a front surface side of the backing layer, and that is disposed at a front surface side of the floor panel.

2. The vehicle lower portion structure according to claim 1, wherein a density of the magnetic material dispersed in portions of the backing layer that correspond to the electromagnetic wave emitting components is higher than a density of the magnetic material dispersed in other portions of the backing layer.

3. The vehicle lower portion structure according to claim 1, wherein the magnetic material is only dispersed in portions of the backing layer that correspond to the electromagnetic wave emitting components.

4. The vehicle lower portion structure according to claim 1, wherein the backing layer is divided into a first portion that corresponds to positions of the electromagnetic wave emitting components, and a second portion that does not correspond to the positions of the electromagnetic wave emitting components, and the magnetic material is only dispersed in the first portion.

5. The vehicle lower portion structure according to claim 1, wherein the electromagnetic wave emitting components comprise at least one of a drive apparatus of the vehicle, high voltage wiring that is connected to the drive apparatus, and a battery pack.

* * * * *